(12) United States Patent
Schubert

(10) Patent No.: US 12,066,487 B2
(45) Date of Patent: Aug. 20, 2024

(54) METHOD AND CIRCUIT FOR SIMPLE MEASUREMENT OF THE PHASE SHIFT BETWEEN TWO DIGITAL CLOCK SIGNALS HAVING THE SAME FREQUENCY

(71) Applicant: Robert Bosch GmbH, Stuttgart (DE)

(72) Inventor: Andreas Schubert, Coswig (DE)

(73) Assignee: ROBERT BOSCH GMBH, Stuttgart (DE)

( * ) Notice: Subject to any disclaimer, the term of this patent is extended or adjusted under 35 U.S.C. 154(b) by 183 days.

(21) Appl. No.: 17/766,965

(22) PCT Filed: Oct. 19, 2020

(86) PCT No.: PCT/EP2020/079334
§ 371 (c)(1),
(2) Date: Apr. 6, 2022

(87) PCT Pub. No.: WO2021/078675
PCT Pub. Date: Apr. 29, 2021

(65) Prior Publication Data
US 2022/0381822 A1 Dec. 1, 2022

(30) Foreign Application Priority Data
Oct. 21, 2019 (DE) ...................... 10 2019 216 148.0

(51) Int. Cl.
*G01R 31/317* (2006.01)
*H03H 7/06* (2006.01)
(Continued)

(52) U.S. Cl.
CPC ......... *G01R 31/31727* (2013.01); *H03H 7/06* (2013.01); *H03K 19/21* (2013.01); *H03K 3/037* (2013.01)

(58) Field of Classification Search
CPC ... G01R 31/31727; G01R 25/005; H03H 7/06
See application file for complete search history.

(56) References Cited

U.S. PATENT DOCUMENTS

| | | | |
|---|---|---|---|
| 6,154,076 A | 11/2000 | Hastings | |
| 2002/0180415 A1* | 12/2002 | Roth | .......................... H03L 7/00 324/76.41 |

(Continued)

OTHER PUBLICATIONS

International Search Report for PCT/EP2020/079334, Issued Jan. 28, 2021.

(Continued)

*Primary Examiner* — Dominic E Hawkins
(74) *Attorney, Agent, or Firm* — NORTON ROSE FULBRIGHT US LLP; Gerard A. Messina

(57) ABSTRACT

A method for simple measurement of phase shift between a first clock signal and a second clock signal is described, each clock signal having a period $T_0$. The method includes: feeding the first clock signal into a first input of a mixer; feeding the second clock signal into a second input of the mixer; feeding the output signal of the mixer into a low pass filter; and measuring the output signal of the low pass filter, with the aid of an output voltage that is normalized to operating voltage of the mixer. A circuit for implementing the method includes a mixer and a low pass filter. The mixer includes a first input for feeding in the first clock signal, and a second input for feeding in the second clock signal. The output of the mixer is connected to the input of the low pass filter.

21 Claims, 8 Drawing Sheets

(51) Int. Cl.
    *H03K 19/21*    (2006.01)
    *H03K 3/037*    (2006.01)

(56) References Cited

U.S. PATENT DOCUMENTS

| | | | | |
|---|---|---|---|---|
| 2002/0180472 | A1* | 12/2002 | Kilian | G01K 7/01 |
| | | | | 374/E7.035 |
| 2015/0153174 | A1* | 6/2015 | Kim | G01C 19/5776 |
| | | | | 73/504.12 |
| 2017/0279439 | A1* | 9/2017 | Iversen | H03K 5/13 |
| 2020/0209301 | A1* | 7/2020 | Karin | G01R 19/0084 |

OTHER PUBLICATIONS

Bishnu Prasad Das et al., "On-Chip Measurement of Rise/Fall Gate Delay Using Reconfigurable Ring Oscillator," IEEE Transactions On Circuits and Systems II: Express Briefs, vol. 61, No. 3, 2014, pp. 183-187. <https://vdocuments.net/on-chip-measurement-of-risefall-gate-delay-using-reconfigurable-ring-oscillator.html> Mar. 31, 2022.

Pei et al., "A Low Overhead On-Chip Path Delay Measurement Circuit," IEEE Asian Test Symposium, 2009, pp. 145-150. <https://ur.booksc.me/book/30840092/2d1c63> Mar. 31, 2022.

Yao et al., "Measurement of Time Delay for a Transmission Line in Frequency Domain," IEEE Conference On Precision Electromagnetic Measurements, 2000, pp. 88-89. <https://in.booksc.eu/book/32075816/927668> Mar. 31, 2022.

Jaya et al., "A High-Resolution On-Chip Propagation Delay Measurement Scheme," IEEE International SOC Design Conference, 2015, pp. 143-144.

Katoh et al., "A Low Area On-Chip Delay Measurement System Using Embedded Delay Measurement Circuit," 19th IEEE Asian Test Symposium, 2010, pp. 343-348.

* cited by examiner (a)

(b)

(a)

(b)

METHOD AND CIRCUIT FOR SIMPLE MEASUREMENT OF THE PHASE SHIFT BETWEEN TWO DIGITAL CLOCK SIGNALS HAVING THE SAME FREQUENCY

FIELD

The present invention relates to a method for simple measurement of the phase shift/the time offset between digital signals having the same frequency. Moreover, the present invention relates to a circuit for simple measurement of the phase shift/the time offset between digital signals having the same frequency.

BACKGROUND INFORMATION

Present-day electronic signal processing very often requires precise temporal control of individual processing steps, or the accurate measurement or generation of small time differences within an integrated circuit. In many cases, for this purpose two or more digital clock signals having same period duration $T_0$, but which are phase-shifted relative to one another in a defined manner, are generated. This is illustrated below with reference to FIGS. 1 and 2.

In addition, the task of verifying the correct function, i.e., the phase shift, and maintaining the specified tolerances under production conditions with the aid of automatic test equipment (ATE) must always be addressed in the design of such systems.

The following problems are often particularly difficult to solve:
1) How is access to the relevant internal signals enabled without resulting in excessive changes to their properties, such as temporal profiles or amplitudes?
2) What measuring devices may be used to measure the necessary parameters in a sufficiently accurate and cost-effective manner?
3) Are the required measuring devices an integral part of the ATE, or may they be integrated into same if necessary?

Most current publications concentrate on circuits that are integrated into the chip, via which the delay of certain signal paths in digital circuits may be measured. The intent of these measurements is to detect manufacturing- or age-related defects by their effect on the delay of the signal path in question. This procedure is intended as a supplement to the other customary defect-oriented methods such as SCAN or IDDQ. Representatives of such are Gibran L. Jaya et al., "A High-Resolution On-Chip Propagation Delay Measurement Scheme," IEEE International SoC Design Conference, Nov. 2-3, 2015, pp. 143-144; Bishnu Prasad Das, Hidetoshi Onodera, "On-Chip Measurement of Rise/Fall Gate Delay Using Reconfigurable Ring Oscillator," IEEE Transactions on Circuits and Systems II: Express Briefs, Volume 61, Issue 3, 2014, pp. 183-187; Songwei Pei et al., "A Low Overhead On-Chip Path Delay Measurement Circuit," IEEE Asian Test Symposium, Nov. 23-26, 2009, pp. 145-150; Kentaroh Katoh et al., "A Low Area On-Chip Delay Measurement System Using Embedded Delay Measurement Circuit," IEEE Asian Test Symposium, Dec. 1-2, 2010, pp. 343-348. Delay chains, oscillators, or even PLLs are typically utilized for the time measurement in order to obtain from the time signals or delays thus generated a basis of comparison for the actual measurement, or to map short time intervals onto much longer intervals with the aid of subsampling.

Another approach presented in Antony Yao, Yao-Huang Kao, "Measurement of Time Delay for a Transmission Line in Frequency Domain," IEEE Conference on Precision Electromagnetic Measurements, May 14-19, 2000, pp. 88-89, is intended for the measurement of signal propagation times in a transmission line. In this method, a known frequency-modulated signal is fed into a transmission line. The output of the transmission line as well as a version of the signal that is phase-shifted by 90° are mixed, subsequently filtered using a low pass filter, and evaluated with the aid of a spectrum analyzer. The signal propagation time in the transmission line may be easily deduced from the obtained results.

However, the currently published circuitry-based approaches and methods require a great deal of additional integrated hardware or costly laboratory equipment (see the reference in the preceding paragraph).

SUMMARY

According to the present invention, a method for measuring the phase shift between a first clock signal and a second clock signal is provided, the clock signals having the same frequency.

The method according to an example embodiment of the present invention for measuring the phase shift between a first clock signal and a second clock signal includes the following steps:
  a-1) feeding the first clock signal into a first input of a mixer;
  a-2) feeding the second clock signal into a second input of the mixer;
  d) feeding the output signal of the mixer into a low pass filter;
  e) measuring the output signal of the low pass filter.

The method allows a very simple measurement of the phase shift solely by measuring an output signal of a low pass filter.

It is also possible for the mixer to include an XOR gate, with step d) including feeding the output signal of the XOR gate into the input of the low pass filter. An XOR gate is a simple, reliable, and inexpensive component with which the mixer and thus the method may be efficiently implemented.

In one particular specific embodiment of the method in accordance with the present invention, it is provided that step a-1) includes feeding the first clock signal into the first input of the XOR gate, and step a-2) includes feeding the second clock signal into the second input of the XOR gate. The method includes the following further step:
  f) normalizing the output signal of the low pass filter to the period duration of the clock signals and the operating voltage of the mixer, the output signal of the low pass filter preferably being multiplied by one-half the period duration and divided by the operating voltage of the mixer. This specific embodiment is a particularly simple variant of the method according to the present invention that is suitable in particular for incoming clock signals, each having the duty cycle ½.

With regard to the terms "first input" and "second input" of the XOR gate used above, it is noted that the two inputs of an XOR gate are basically equivalent and may be interchanged. The terms "first input" and "second input" are used here solely to distinguish between the inputs; i.e., the "first input" is an arbitrary input of the XOR gate, and the "second input" is the other input of the gate. The same also applies below for the AND gate and the OR gate.

Alternatively, it is advantageously provided that the method in accordance with an example embodiment of the present invention uses a mixer that includes a first edge-controlled flip-flop and a second edge-controlled flip-flop as well as an AND gate.

Step a-1) includes feeding the first clock signal into the dynamic input of the first flip-flop, and step a-2) includes feeding the second clock signal into the dynamic input of the second flip-flop. In addition, the method includes the following further steps:

b-1) feeding the output signal of the first flip-flop into the first input of the XOR gate and into the first input of the AND gate;

b-2) feeding the output signal of the second flip-flop into the second input of the XOR gate and into the second input of the AND gate;

c-1) relaying the output signal of the AND gate to the reset input of the first flip-flop;

c-2) relaying the output signal of the AND gate to the reset input of the second flip-flop.

This specific embodiment of the method of the present invention may have the advantage that it is independent of the duty cycles of the input signals.

In one particular specific embodiment of the method of the present invention, the mixer also includes an OR gate and an inverter, and step c-1) includes feeding the output signal of the AND gate into the first input of the OR gate, and feeding the output signal of the OR gate into the reset input of the first flip-flop. Step c-2) includes feeding the output signal of the AND gate into the first input of the OR gate, and feeding the output signal of the OR gate into the reset input of the second flip-flop. In this specific embodiment the method includes the following further steps:

feeding a constant activation signal into the data input of the first flip-flop, into the data input of the second flip-flop, and into the input of the inverter;

feeding the output signal of the inverter into the second input of the OR gate.

The start and the end of the measurement of the phase shift may be precisely controlled in this way.

In one preferred specific embodiment of the method of the present invention, the following further step is provided:

f) normalizing the output signal of the low pass filter to the period duration of the clock signals and the operating voltage of the mixer, preferably either the output voltage of the low pass filter being multiplied by the period duration and divided by the operating voltage of the mixer if the output voltage of the low pass filter is less than one-half the operating voltage of the mixer, or the difference between the operating voltage of the mixer and the output voltage of the low pass filter being multiplied by the period duration and divided by the operating voltage of the mixer if the output voltage of the low pass filter is greater than one-half the operating voltage of the mixer or is equal to one-half the operating voltage of the mixer. This specific embodiment allows the phase shift to be read out in a particularly simple manner.

A further aspect of the present invention relates to a circuit for measuring the phase shift between a first clock signal and a second clock signal. In accordance with an example embodiment of the present invention, the circuit includes a mixer and a low pass filter. The mixer includes a first input for feeding in the first clock signal, and a second input for feeding in the second clock signal. In addition, the output of the mixer is connected to the input of the low pass filter. The circuit allows a very simple measurement of the phase shift solely by measuring its output signal.

It is also possible for the mixer to include an XOR gate in the circuit, the output of the XOR gate being connected to the input of the low pass filter. An XOR gate is a simple, reliable, and inexpensive component with which the mixer may be efficiently implemented.

In one particular specific embodiment of the circuit according to the present invention, it is provided that the first input of the mixer is the first input of the XOR gate, and the second input of the mixer is the second input of the XOR gate. This specific embodiment is a particularly simple variant of the circuit according to the present invention that is suited in particular for incoming clock signals each having the duty cycle ½.

Alternatively, it is advantageously provided in accordance with an example embodiment of the present invention that the mixer also includes a first edge-controlled flip-flop and a second edge-controlled flip-flop as well as an AND gate. The first input of the mixer is the dynamic input of the first flip-flop, and the second input of the mixer is the dynamic input of the second flip-flop. In addition, the output of the first flip-flop is connected to the first input of the XOR gate and to the first input of the AND gate, and the output of the second flip-flop is connected to the second input of the XOR gate and to the second input of the AND gate. The mixer includes a connection between the output of the AND gate and the reset input of the first flip-flop. The mixer also includes a connection between the output of the AND gate and the reset input of the second flip-flop. This specific embodiment of the circuit has the advantage that the phase shift may thus be measured independently of the duty cycles of the input signals.

In one particular specific embodiment of the circuit of the present invention, the mixer also includes an OR gate and an inverter. The connection between the output of the AND gate and the reset input of the first flip-flop and to the reset input of the second flip-flop extends via the OR gate. In particular, the output of the AND gate is connected to the first input of the OR gate. The output of the OR gate in turn is connected to the reset input of the first flip-flop and also to the reset input of the second flip-flop. The mixer also includes a third input, the third input of the mixer being connected to the data input of the first flip-flop, to the data input of the second flip-flop, and to the input of the inverter. The output of the inverter is connected to the second input of the OR gate. The start and the end of the measurement of the phase shift may be controlled very precisely in this way.

According to one preferred specific embodiment of the circuit according to the present invention, it is provided that the circuit is an integrated circuit. The circuit may be implemented very easily in common electronic devices such as PCs, tablets, smart phones, and the like.

The circuit according to the present invention advantageously includes a low pass filter that is designed as a passive low pass filter. The passive low pass filter may include a resistor and a capacitor. This allows a simple and cost-effective implementation of a low pass filter.

According to one preferred specific embodiment of the circuit according to the present invention, it is provided that the XOR gate is a highly symmetrical XOR gate. This allows particularly reliable and precise measurements of the phase shift.

Advantageous refinements of the present invention are disclosed herein. The advantages of the present invention over the concepts mentioned at the outset are in particular the following:

The measurement of the phase shift/the time offset between two digital signals having the same frequency is independent of the duty cycle.

The phase shift is converted into a proportional direct voltage, and requires only a voltmeter for the measurement.

The complexity of the circuitry-based implementation is very low, and imposes no special requirements on the precision of the components.

The approach according to the present invention is thus suited in particular for the integration into integrated circuits.

BRIEF DESCRIPTION OF THE DRAWINGS

Exemplary embodiments of the present invention are explained in greater detail based on the figures and the following description.

DETAILED DESCRIPTION OF EXAMPLE EMBODIMENTS

Figure 1:
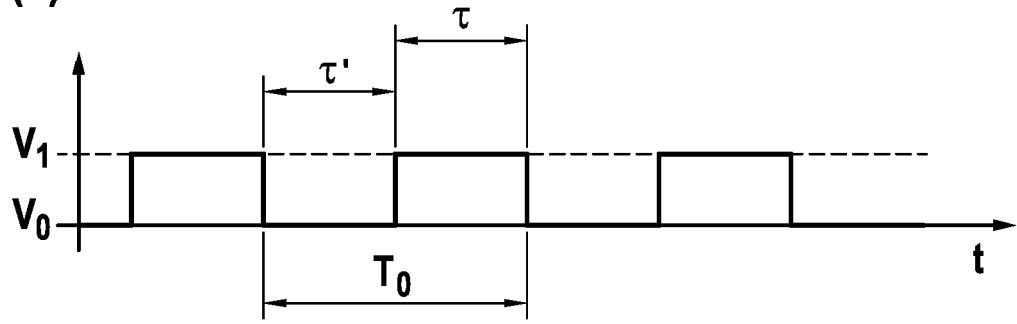
FIG. 1 shows an illustration of two digital clock signals having different duty cycles (related art).
Figure 1:
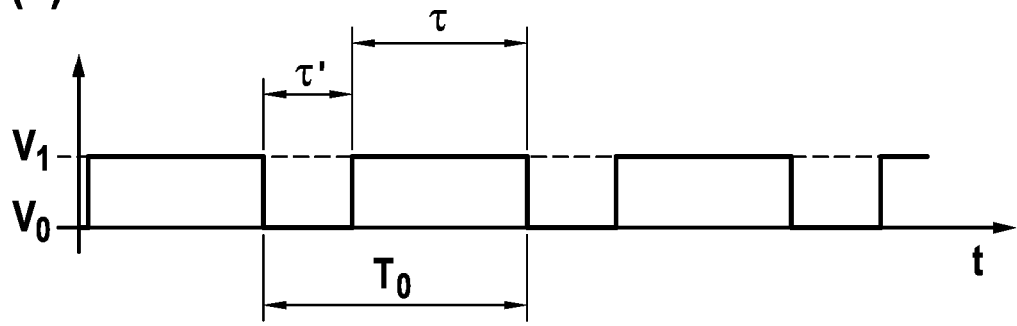

FIG. 1 is used to explain several terms used below. The term "signal" is understood here to mean a measured variable (amplitude), in particular a voltage V, that is a function of time t. A signal is "digital" when the amplitude can assume only two values. These values are typically referred to as "logical 0" and "logical 1." FIG. 1 shows signals that are expressed as a function $V(t)$, i.e., as voltage V as a function of time t. The illustrated signals are "digital" due to the fact that voltage V in each case assumes only two values, namely, $V_0$ and $V_1$. $V_0$ (typically $V_0=0$; i.e., no voltage is present) corresponds to "logical 0," and $V_1$ (typically a voltage greater than $V_0$) corresponds to "logical 1."

FIG. 1, (a) and (b) each show a "periodic" signal, since the shape of the signal temporally repeats with period duration $T_0$; i.e., $V(t)=V(t+T_0)$ applies for all t. However, the "duty cycles" of the illustrated signals, i.e., the ratios of the pulse duration (duration of logical 1)—denoted in the figure by reference symbol τ—to period duration $T_0$, are different. In FIG. 1 (a) the duty cycle is ½, since pulse duration τ is precisely one-half of period duration $T_0$, or in other words, because duration τ of logical 1 corresponds exactly to duration τ' of logical 0. In contrast, in FIG. 1 (b) the duty cycle is greater than ½, since pulse duration τ is greater than one-half of period duration $T_0$, or in other words, because duration τ of logical 1 exceeds duration τ' of logical 0.

Only digital signals are considered in the following discussion. To maintain clarity in the figures, in the subsequent illustrations of the digital signals the coordinate axes and their descriptions are omitted; it is clear that in each case they may be supplemented, as illustrated in FIG. 1.

Figure 2:
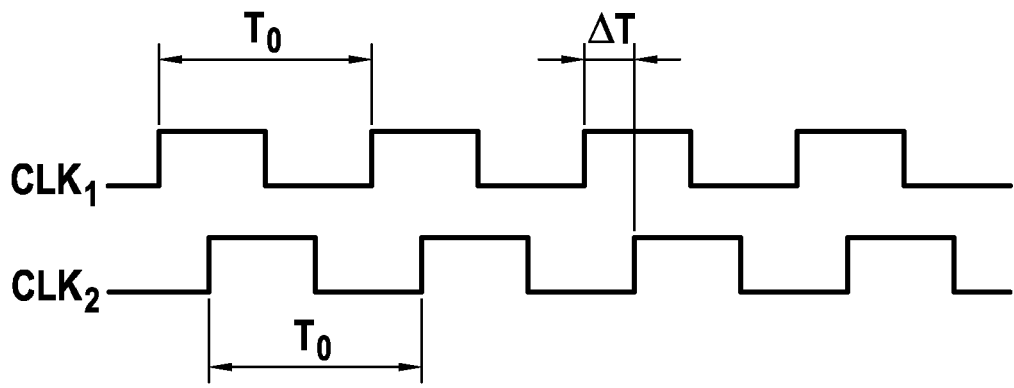
FIG. 2 shows an example of two clock signals $CLK_1$ and $CLK_2$ having same period duration $T_0$, and which are phase-shifted by time offset $\Delta T$ (related art).

FIG. 2 schematically shows an example of two digital periodic clock signals $CLK_1$ and $CKL_2$ (situated one on top of the other) that have same period duration $T_0$, and that are shifted relative to one another by a time offset $\Delta T$, or in other words, have a phase shift $\Delta T$.

It is noted that it is generally sufficient to ascertain absolute time offset $|\Delta T|$, since typically only the phase shift between the signals is important, not for which of signals $CLK_1$ and $CLK_2$ the start of a period occurs "earlier." Since the signals are periodic, establishing specific start $t_0$ and end $t_0+\Delta T$ of a period is arbitrary anyway, and only the time difference between the start and the end must correspond to period duration $T_0$. For the same reason, it ultimately makes no difference whether a time offset is expressed as $|\Delta T|$ or $|T_0-\Delta T|$; it is usually expressed here as $\min\{|\Delta T|, |T_0-\Delta T|\}$.

Figure 3:
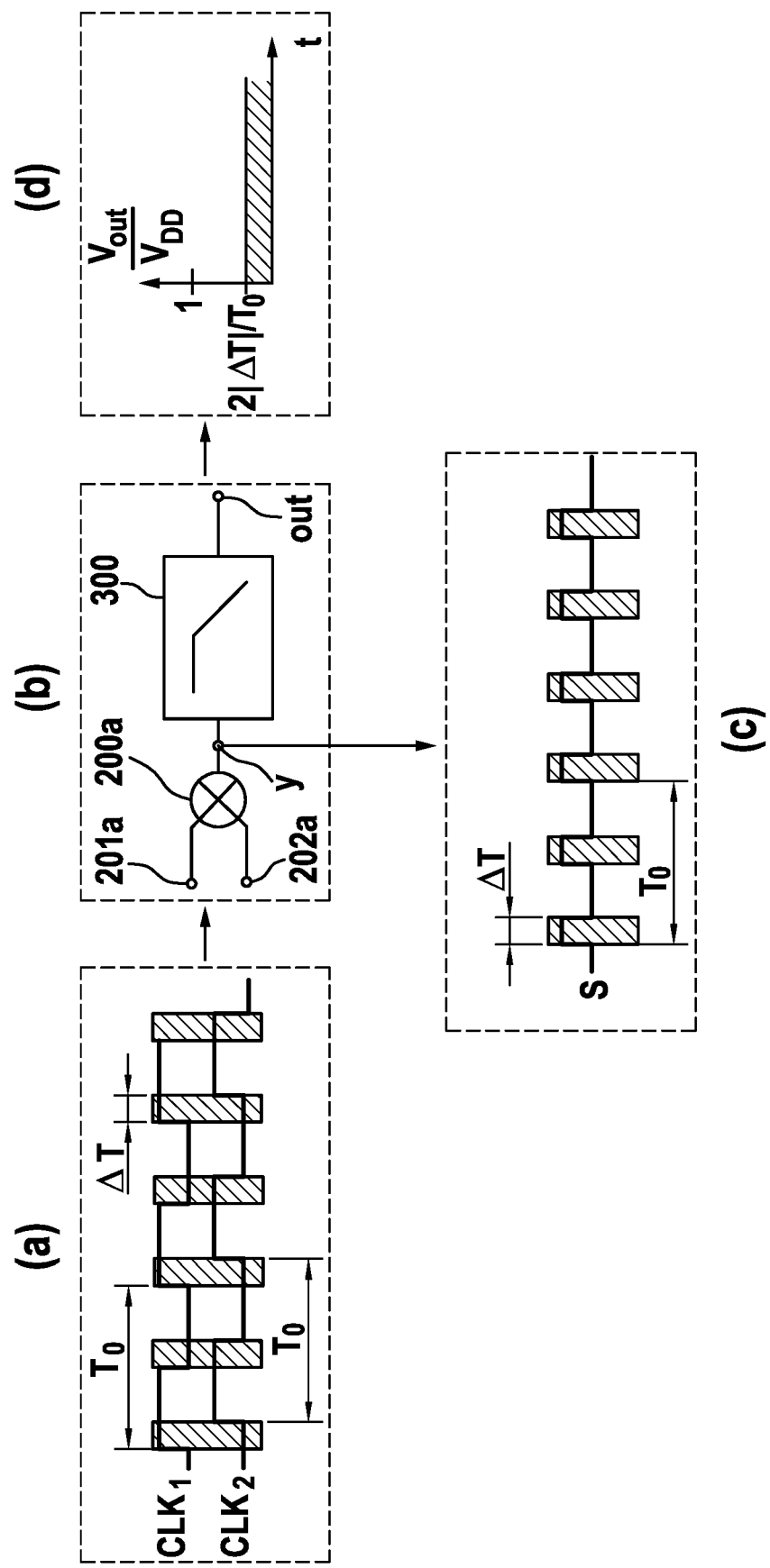
FIG. 3 shows an illustration of the principle of measuring the phase shift between two clock signals having the same frequency.

The method provided here in accordance with the present invention is also used for mixing two clock signals having the same frequency. The method is schematically illustrated in FIG. 3. Signals $CLK_1$ and $CLK_2$ shown in FIG. 3 (a) correspond to those described above with reference to FIG. 2. Clock signals $CLK_1$ and $CLK_2$ in particular have the same frequency (period duration $T_0$), and in addition each have the duty cycle ½ (cf. FIG. 1 (a)). Their phase shift $\Delta T$, highlighted by the crosshatched areas, is unknown and is to be determined with the aid of the measuring system schematically illustrated in FIG. 3 (b). For this purpose, initially signals $CLK_1$ and $CLK_2$ are mixed together; i.e., first signal $CLK_1$ is fed into a first input 201a of a mixer 200a, and signal $CLK_2$ is fed into the second input of mixer 200a.

Since the duty cycles of both signals is ½, a signal s having twice the frequency of signals $CLK_1$ and $CLK_2$ is obtained at the mixer output, i.e., at node y. This is schematically illustrated in FIG. 3 (c), with the pulses, i.e., the times at which the signal supplies a logical 1, once again being highlighted with crosshatched areas. The resulting duty cycle of signal s at the output of mixer 200a is a function of the phase shift between signals $CLK_1$ and $CLK_2$. With the aid of low pass filtering, the high-frequency signal components may be suppressed, and direct component $2 \cdot |\Delta T|/T_0$, normalized to the full signal swing (i.e., signal voltage $V_1$ corresponding to logical 1 (cf. FIG. 1)), remains. The direct component of periodic signal s is the constant term in the progression of signal s into a Fourier series. The constant term corresponds precisely to the surface area of function $s(t)$ over a full period $T_0$, and is normalized to this period $T_0$; it may therefore be taken directly from FIG. 3 (c).

Consequently, output signal y of mixer 200a is initially fed into a low pass filter 300 (cf. FIG. 3 (b)), whose essentially constant (see above) output voltage $V_{out}$ at the output (out) of low pass filter 300 then represents the measured variable for determining $\Delta T$ (cf. FIG. 3 (d)). In particular, only a voltmeter is needed for measuring the signal swing at the output of the low pass filter, i.e., output voltage $V_{out}$.

Figure 4:
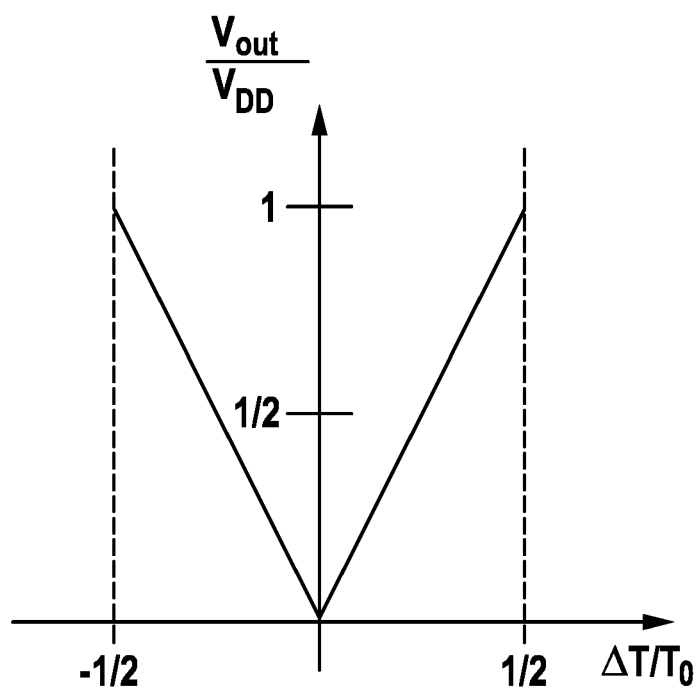
FIG. 4 shows a normalized transfer function of the measuring system according to FIGS. 3 and 5.

The relationship between the signal swing at the output of low pass filter 300 and the (one-half) duty cycle of signal s at the output of mixer 200a are shown in FIG. 4, the output voltage at low pass filter 300 being illustrated here normalized to the full signal swing, i.e., operating voltage $V_{DD}$ of mixer 200a. In particular, FIG. 4 shows that the transfer function of the measuring system according to FIG. 3 (b) is piecewise-linear. When signals $CLK_1$ and $CLK_2$ to be compared have a time offset $\Delta T$ that corresponds exactly to one-half of period duration $T_0$, the signal swing at the low pass output is at a maximum.

Thus, for measuring (absolute) time offset $|\Delta T|$, it is necessary only to measure direct voltage $V_{out}$ at the low pass output, using a standard voltmeter or multimeter. The time offset between the two signals may then be ascertained by computation from measured and known variables. In particular, it is apparent from FIG. 3 (d) and the (piecewise) linearity of the transfer function from FIG. 4 that duty cycle $2 \cdot |\Delta T|/T_0$ of signal s at the output of mixer 200a corresponds precisely to output voltage $V_{out}$ at low pass filter 300 normalized to operating voltage $V_{DD}$ of mixer 200a.

The absolute value of time offset $|\Delta T|$ may thus be expressed by $$|\Delta T| = T_0 \cdot \frac{V_{out}}{2V_{DD}}, \quad (1)$$

where $T_0$ is the period duration, $V_{DD}$ is the operating voltage of the mixer, and $V_{out}$ is the direct voltage at the output of the low pass filter.

Figure 5:
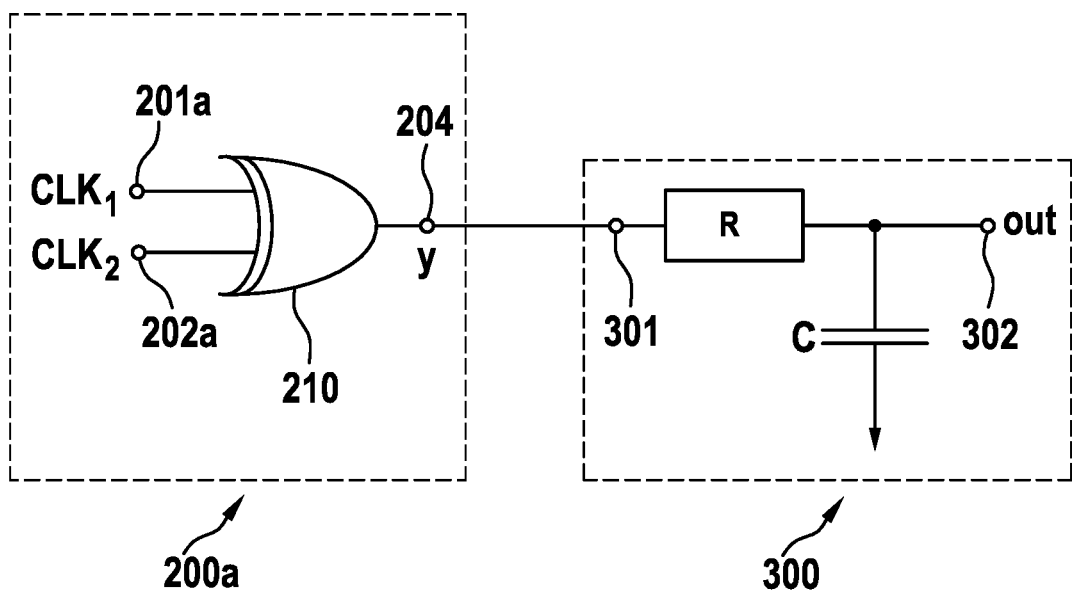
FIG. 5 shows a specific example embodiment of the circuit according to the present invention for measuring the phase shift between two digital clock signals having the same frequency.

An XOR gate is the simplest way to implement such a mixer 200a. This gate supplies a logical 1 at the output when the signals at the inputs are different, exactly as illustrated in FIGS. 3 (a) and (c). The measuring system shown in FIG. 3 (b) may be implemented, for example, using a design as illustrated in FIG. 5. Each of clock signals $CLK_1$ and $CLK_2$ to be compared is respectively fed into one of the two inputs 201a and 202a of an XOR gate 210, whose output (node y) is then used as the output of the mixer and is connected to the input of a passive low pass filter 300.

Low pass filter 300 may be easily implemented, for example, by the combination of resistor R and capacitor C shown in FIG. 5. One terminal 301 of resistor R is used as the input of low pass filter 300, and the other terminal of resistor R is used as the output (out) of the low pass filter, which, however, at the same time is connected to ground via capacitor C.

However, in this simple implementation of a mixer with the aid of an XOR gate, it should be noted that the duty cycles of signals $CLK_1$ and $CLK_2$ to be compared influence the result. In other words, the arrangements and results described in conjunction with FIGS. 3 through 5 may generally be used only when signals $CLK_1$ and $CLK_2$ reliably have the duty cycle ½. In the general case, in which not only time offset $\Delta T$ but also the duty cycles of signals $CLK_1$ and $CLK_2$ are unknown, the measuring system must be appropriately modified.

Figure 6:
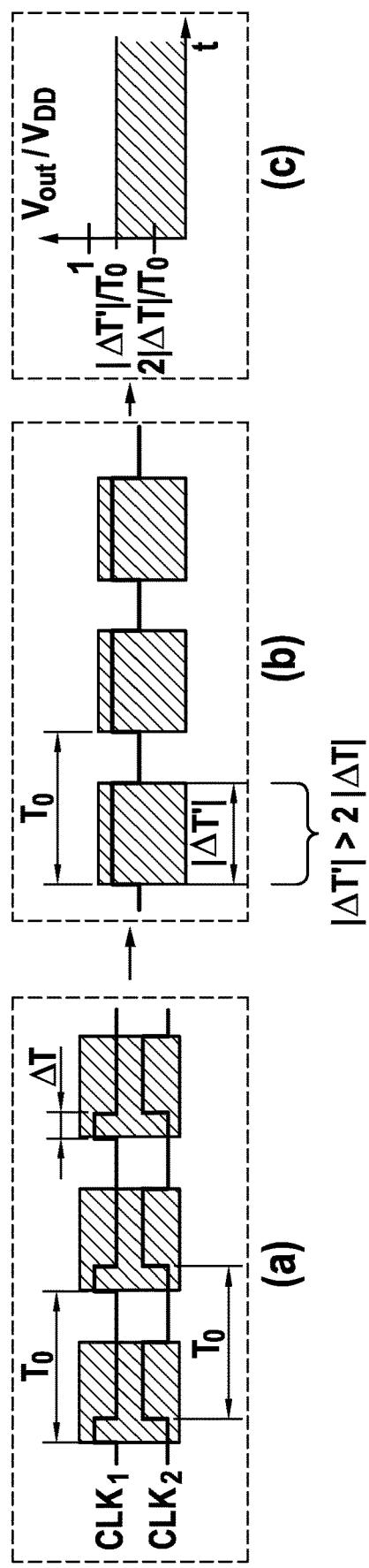
FIG. 6 shows for two clock signals, at least one of which has a duty cycle different from ½, the mixed product and the filtered result when the measuring system according to FIG. 3 is used.

The phenomenon of the influence of the duty cycles of signals $CLK_1$ and $CLK_2$ to be compared on the transfer function when the measuring system according to FIG. 3 (b) or FIG. 5 is used is illustrated in FIGS. 6 (a) through (c). As is apparent from FIG. 6 (a), time offset $\Delta T$ is unchanged compared to the situation from FIG. 3. However, although second clock signal $CLK_2$ in FIG. 6 (a) likewise remains unchanged in comparison to the second clock signal from FIG. 3 (a) and thus still has a duty cycle of ½, the duty cycle of signal $CLK_1$ in FIG. 6 (a) is reduced in comparison to that in FIG. 3 (a), since the ratio of the duration of the signal pulse (logical 1) in a period $T_0$ of signal $CLK_1$ to period $T_0$ is now smaller. Times t in which either only signal $CLK_1$ supplies a pulse or only signal $CLK_2$ supplies a pulse are highlighted in crosshatch in FIG. 6 (a) for clarification. Thus, mixing signals $CLK_1$ and $CLK_2$ with the aid of an XOR gate, as described in the context of FIGS. 3 through 5, supplies a logical 1 at the output of the mixer specifically at the points in time denoted by the crosshatched highlighting in FIG. 6 (a), which is likewise illustrated by crosshatched highlighting in FIG. 6 (b).

With the aid of low pass filters, as described above the duty cycle of the signal illustrated in FIG. 6 (b) may now be measured at the output of the mixer (XOR gate). However, the width of the crosshatched highlighting for each period in FIG. 6 (a) and (b) now directly indicates that the duration of logical 1 for each period at the output of the XOR gate, denoted as $|\Delta T'|$ in the figure, is greater than twice time offset $|\Delta T|$. Thus, for constant signal swing $V_{out}/V_{DD}$, normalized to operating voltage $V_{DD}$ of the mixer, at the output of low pass filter, $V_{out}/V_{DD}=|\Delta T'|/T_0>2 \cdot |\Delta T|/T_0$ applies, as illustrated in FIG. 6 (c). Formula (1), developed for measuring and ascertaining absolute time offset $|\Delta T|$ (see above) for the simple case of a duty cycle of ½ for both signals, based on FIGS. 3 through 5, is thus no longer usable in this way in the case of arbitrary duty cycles, since, without knowledge of the greatly differing different duty cycles, an absolute time offset of $|\Delta T'|$ that does not match actual value $|\Delta T|$ would be ascertained as the result.

Figure 7:
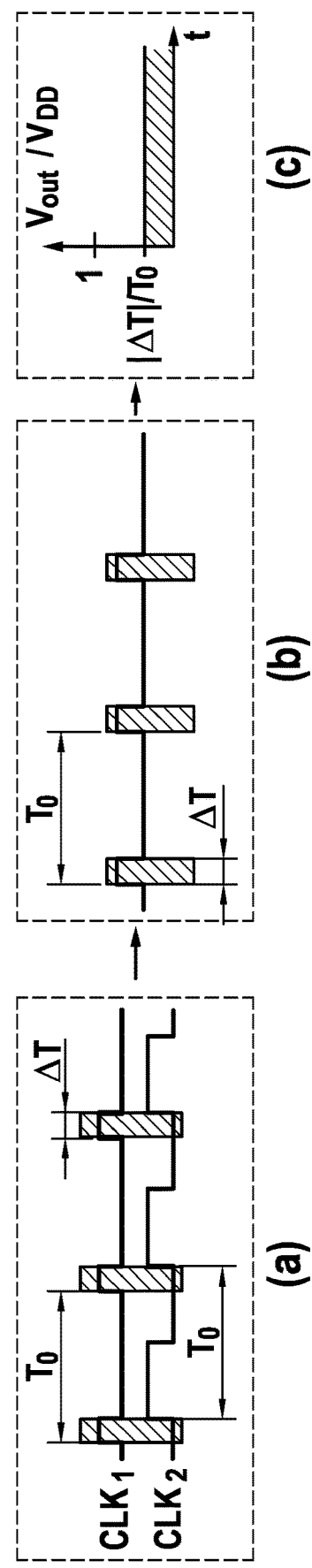
FIG. 7 shows, for the same incoming clock signals as in FIG. 6(a), the mixed product and the filtered result when the measuring system according to FIG. 9 is used.

For an accurate measurement of the time offset between $CLK_1$ and $CLK_2$ that is independent of the duty cycle, the method must be modified as illustrated in FIGS. 7 (a) through (c). The crosshatched areas in FIG. 7 (a) denote for each period the time period between the points in time of occurrence of the respective rising edge of signals at $CLK_1$ and $CLK_2$. The rising edges of the signals remain disregarded. By use of a suitable mixer circuit, the times denoted in crosshatch in FIG. 7 (a) are subsequently filtered out; in other words, the mixer at its output supplies a logical 1 for the duration between the points in time of the rising edges of signals $CLK_1$ and $CLK_2$, and otherwise supplies a logical 0. This is illustrated in FIG. 7 (b). It is apparent from the figure that for each period, a logical 1 is then supplied at the output of the mixer for the exact duration of absolute time offset $|\Delta T|$. The constant component of the signal from FIG. 7 (b) may then be ascertained once again, as described above, using a low pass filter downstream from the mixer; (constant) output voltage $V_{out}/V_{DD}$ of the constant component of the signal, normalized to operating voltage $V_{DD}$ of the mixer, then corresponds precisely to absolute time offset $|\Delta T|$ of signals $CLK_1$ and $CLK_2$ normalized to period duration $T_0$; i.e., $V_{out}/V_{DD}=|\Delta T|/T_0$ (cf. FIG. 7 (c)).

Figure 8:
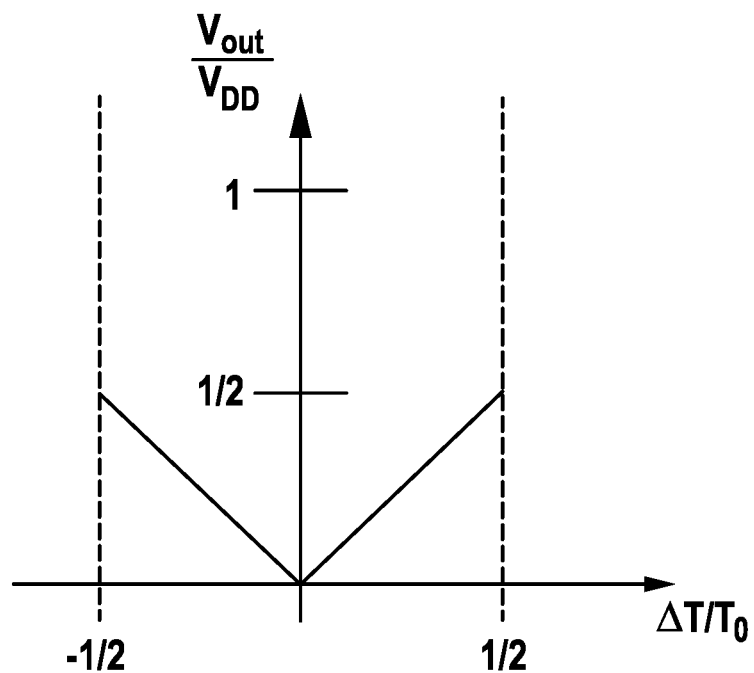
FIG. 8 shows a normalized transfer function of the measuring system illustrated in FIG. 9.
Figure 8:
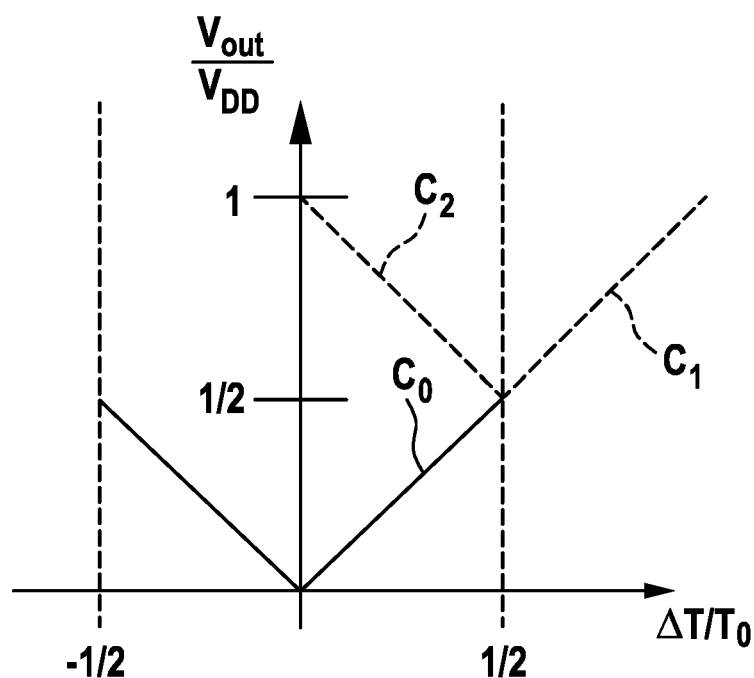

The transfer function of such a circuit is illustrated in FIG. 8 (a) for time offsets in range $|\Delta T|/T_0 \leq ½$. As described above, the constant component at the filter output, normalized to the signal swing, is now $|\Delta T|/T_0$. The steepness of the transfer function is therefore only half as great as in the method according to FIG. 3, since a doubling of the frequency at the mixer output no longer takes place.

FIG. 8 (b) expands the region of FIG. 8 (a); in range $|\Delta T|/T_0 \leq ½$ and $V_{out}/V_{DD} \leq ½$, the relationship from FIG. 8 (b) matches the transfer function from FIG. 8 (a) (section $C_0$ of the shown relationship, illustrated as a solid line). However, depending on the particular point in time at which the measurement of signals $CLK_1$ and $CLK_2$ in FIG. 7 (a) is started, time offsets $T_0$ with $T_0 \geq |\Delta T| > T_0/2$ may also occur. Such time offsets result in normalized signal swings $V_{out}/V_{DD}$ at the filter output with $V_{out}/V_{DD} > \frac{1}{2}$, or equivalently, $V_{out} > V_{DD}/2$. This corresponds to section $C_1$, denoted by a dashed line, of the relationship illustrated in FIG. 8 (b). However, as noted above, for measured time offsets $|\Delta T|$ with $T_0 \geq |\Delta T| > T_0/2$, generally not $|\Delta T|$, but instead preferably $|T_0 - \Delta T|$, would be stated, since $|T_0 - \Delta T| \leq T_0/2$ then once again applies. This is equivalent to folding over (mirroring) section $C_1$ in FIG. 8 (b) at the vertical through point $|\Delta T|/T_0 = \frac{1}{2}$ (section $C_2$ of the relationship).

The modification of the method described in FIGS. 7 (a) through (c) and 8 (a) and (b), previously described with reference to FIGS. 3 through 5, thus results in a different computation of the absolute time offset, which, as may be determined from FIG. 8, may be ascertained as follows:

$$|\Delta T| = \frac{T_0}{V_{DD}} \cdot \begin{cases} V_{out} & \text{for } V_{out} \leq V_{DD}/2 \\ V_{DD} - V_{out} & \text{for } V_{out} > V_{DD}/2 \end{cases}, \quad (2)$$

where once again $T_0$ is the period duration, $V_{DD}$ is the operating voltage of the mixer, and $V_{out}$ is the direct voltage at the output of the low pass filter.

Of course, the modified method described above for determining the absolute time offset of two digital clock signals having the same frequency also requires a different mixer than the XOR gate used in the simple method according to FIGS. 3 through 5.

For implementing the circuitry-based method illustrated in FIGS. 7 (a) through (c), this means that the rising clock edge of the leading signal opens the signal path, and thus a logical 1 is present at an input of the mixer until a rising edge of the second signal blocks the signal path, and in each case a logical 0 is once again present at both inputs of the mixer.

Figure 9:
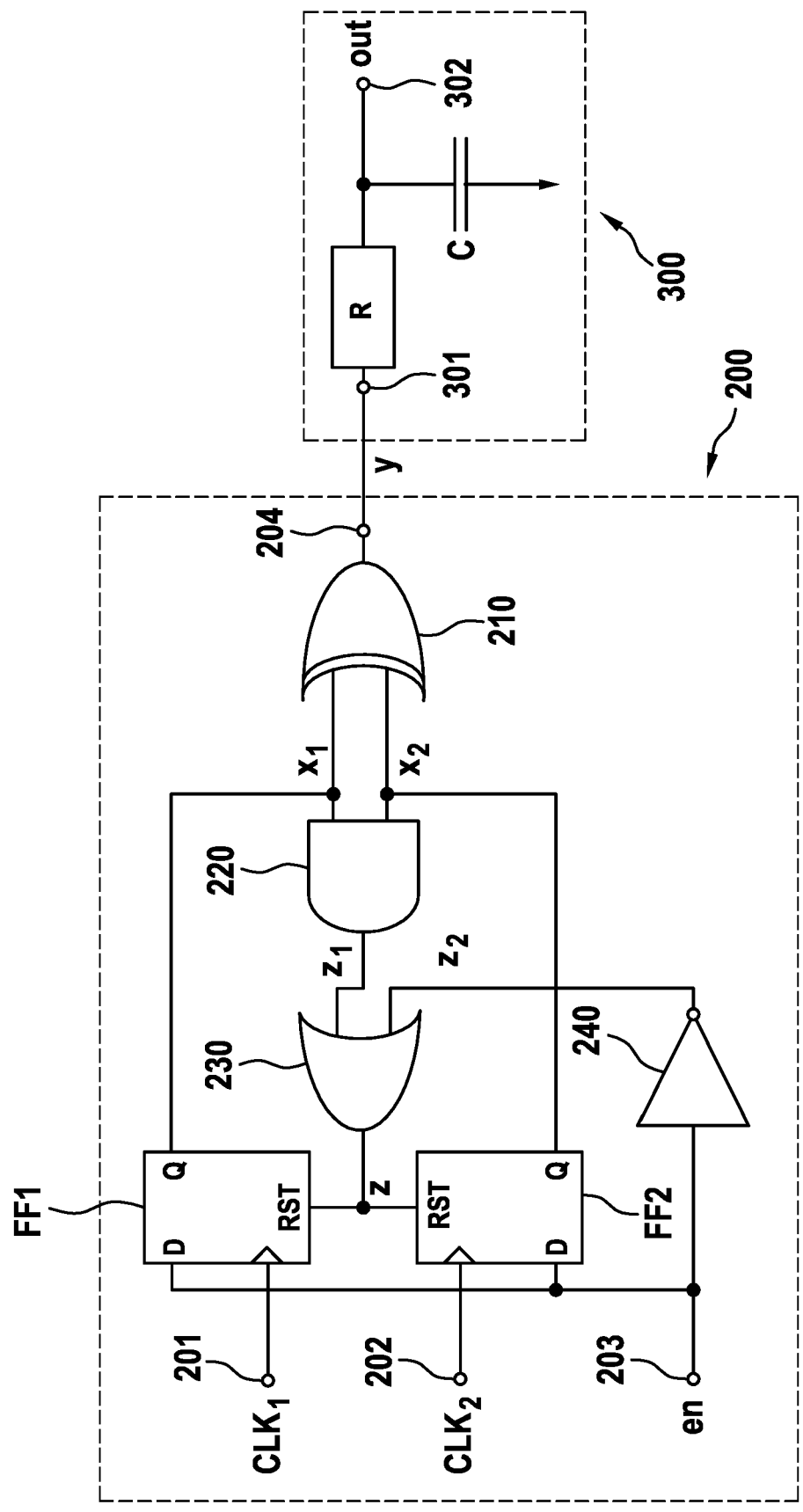
FIG. 9 shows a circuitry embodiment (measuring system) for implementing the measuring method from FIG. 7.

The circuit illustrated in FIG. 9 implements the method illustrated in FIGS. 7 (a) through (c). The circuit includes a mixer 200 and a low pass filter 300. The two signals $CLK_1$ and $CLK_2$ serve dynamic inputs (clock inputs) 201 and 202, respectively, of flip-flops FF1 or FF2, as denoted in each case by circuitry symbol "▷". Outputs Q of the flip-flops are connected to an input of an XOR gate 210 via node $x_1$ or $x_2$, respectively, and also to an input of an AND gate 220.

When the circuit is active, i.e., en=1 (where "en" stands for "enable"), the outputs of flip-flops FF1 and FF1 at the respective rising edges of $CLK_1$ or $CLK_2$ accept the piece of data from respective data inputs D of the flip-flops at outputs Q. The outputs are set, i.e., are logical 1's.

Flip-flops FF1 and FF2 are reset in each case with the aid of a combinational circuit made up of AND gate 220, an OR gate 230, and an inverter 240. This takes place either as soon as both flip-flops are set, or if en=0. As a result of this design, various logical signal values are present at the inputs of XOR gate 210 only for the exact duration of time offset $|\Delta T|$ between $CLK_1$ and $CLK_2$. This is totally independent of the duty cycles of signals $CLK_1$ and $CLK_2$.

The mixing of the signals on nodes $x_1$ and $x_2$ is carried out using XOR gate 210. The mixed product at output 204 of XOR gate 210 (i.e., the signal at node y) is filtered using a passive low pass filter 300 made up of a resistor R and a capacitor C (also see the description for FIG. 5). As a result, the high-frequency signal components are suppressed, and essentially only the constant component of the mixed product is provided at the output (out) of the circuit.

Figure 10:
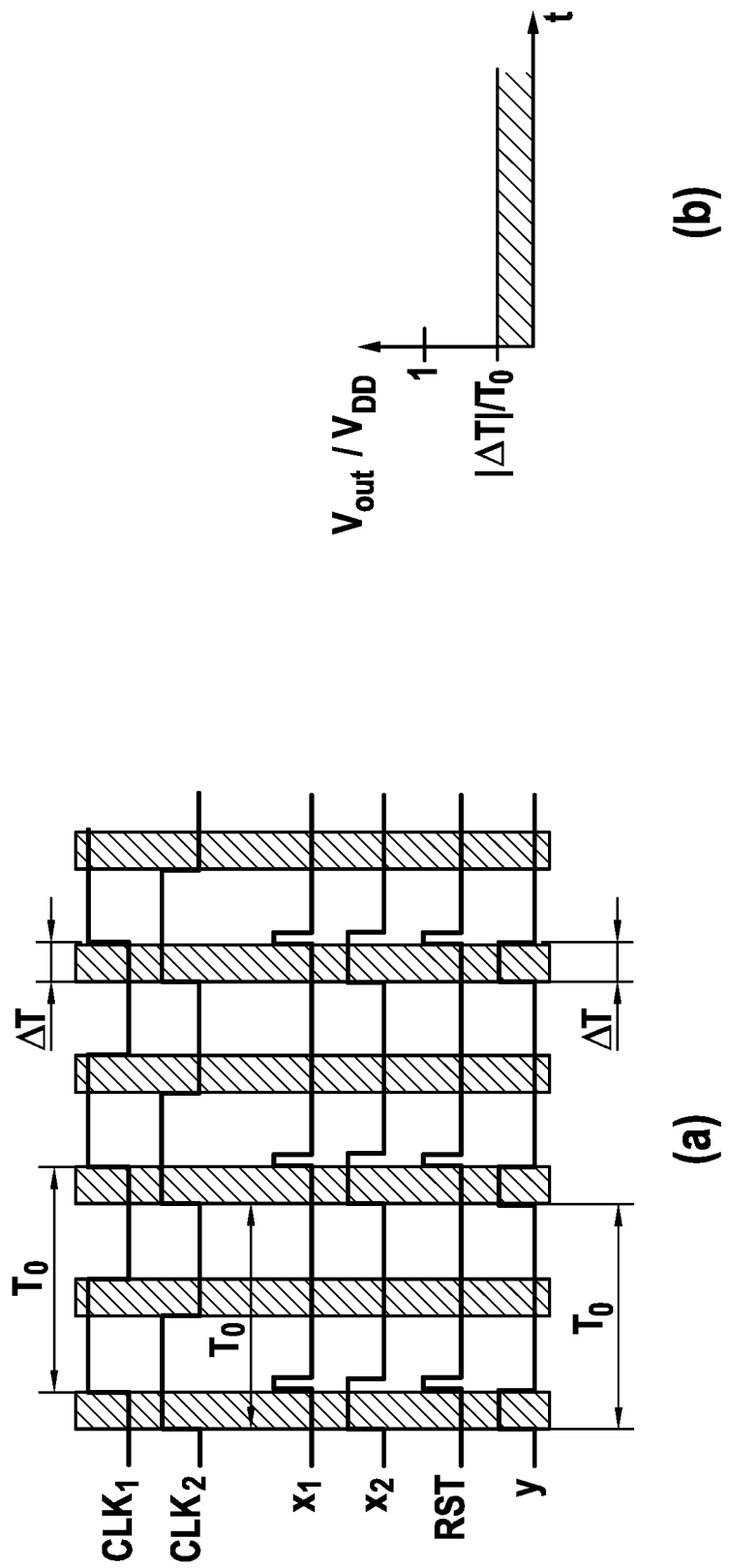
FIG. 10 shows a temporal pattern of the signals within the circuit from FIG. 9, and of the signals at the dynamic inputs and the reset inputs of the flip-flops in the circuit from FIG. 9.

FIG. 10 illustrates by way of example the temporal pattern of the signals at the nodes of the circuit in FIG. 9, and at the dynamic inputs and the reset inputs of the flip-flops in this circuit. At the very top, illustrated once again are the two input clock signals $CLK_1$ and $CLK_2$ having the same frequency, with period $T_0$ and phase shift $\Delta T$, based on the example described in FIGS. 2 and 3 (a). The signals underneath, denoted by reference symbols $x_1$ and $x_2$, correspond to the voltage patterns at nodes $x_1$ and $x_2$ in FIG. 9, and arise when en=1 is set at this circuit (i.e., a logical 1 is set at inverter 240 and at the data inputs of flip-flops FF1 and FF2), and signals $CLK_1$ and $CLK_2$ are fed into the dynamic inputs (clock inputs) of flip-flops FF1 or FF2. Due to en=1, OR gate 230 simply relays the signal present at node $z_1$ to its output, and thus to the reset inputs of flip-flops FF1, FF2 via node z.

At the start of the measurement, signal $CLK_2$ initially supplies a rising edge, so that output Q of second flip-flop FF2 switches, i.e., a logical 1 is set there, which is then present at the first input of XOR gate 210 and likewise at the first input of AND gate 220 (node $x_2$). However, signal $CLK_1$ is still at a logical 0, so that the Q output of first flip-flop FF1 still supplies a 0. The XOR gate thus switches; i.e., at its output 204 and thus at node y a 1 is supplied (lowest signal in the figure), which is then passed on to low pass filter 300. However, the AND gate at its output remains at a 0, as the result of which, via node z, a 0 is also present at reset inputs RST of both flip-flops (signal denoted by reference symbol RST in the figure). The duration of the above-described state is denoted in the figure by the left crosshatched highlight.

As soon as first clock signal $CLK_1$ also supplies a 1, i.e., beginning with the first rising edge of $CLK_1$, a 1 is also set at the Q output of first flip-flop FF1, and the 1 is then present, via node $x_1$, at the second input of XOR gate 210 and at the same time at the second input of AND gate 220. Thus, at that moment a logical 1 is set on both nodes $x_1$ and $x_2$ (the circuit is in this state for only a very short time, characterized here by the duration of the first pulse of signal $x_1$ (see below)). At its output 204, XOR gate 210 thus switches a 0, which is then transferred to the low pass filter via node y, and at its output AND gate 220 switches a 1, which is then relayed to the reset inputs of the two flip-flops via OR gate 230 and nodes $z_1$ and z. As a result, at their respective Q outputs both flip-flops now switch a 0, which (via nodes $x_1$ and $x_2$) is then present at both inputs of XOR gate 210 and of AND gate 220, so that XOR gate 210 as well as AND gate 220 switch to 0 at their respective output. Thus, the signal at node y is set to 0 and passed on to low pass filter 300. The reset inputs of the flip-flops are likewise set to 0 via nodes $z_1$, z and OR gate 230. Thus, in summary, nodes $x_1$, $x_2$, y and the reset inputs of the flip-flops are set to 0 (state prior to the second crosshatched strip in the figure, viewed starting from the left).

This state does not change, even if signals $CLK_1$ and $CLK_2$ drop back to 0, since this does not affect the state of the Q outputs of the flip-flops. Nodes $x_1$, $x_2$, y and the reset inputs of the flip-flops thus continue to remain at 0 (states of the circuit over the duration of the second crosshatched strip, viewed starting from the left, to the start of the third crosshatched strip in the figure). This corresponds to the original state. The above-described procedure now repeats upon reaching the second rising edge of second signal $CLK_2$.

As is apparent in the figure from the signal at node y, for each period $T_0$ this node is set to 1 for the exact duration of phase shift $\Delta T$. The signal of node y is then fed into the low pass filter, which, as described above, then filters out the constant component of the signal, which may then be measured with a voltmeter, and after appropriate normalization (see above) corresponds precisely to value $|\Delta T|/T_0$, which via equation (2) described above may be immediately converted into absolute time offset $|\Delta T|$ of incoming clock signals $CLK_1$ and $CLK_2$.

When the above-described circuit is used, for each period small pulse widths result for the signals at node z (i.e., at reset inputs RST of the flip-flops) and $x_1$, as well as a temporal overhang of the signal pulse at node $x_2$ beyond the end of the signal pulse at node y. These small pulse widths as well as the stated temporal overhang of the signal pulse at node $x_2$ are determined by the signal propagation time through the chain made up of the AND gate and the OR gate. In particular, the pulse width is approximately equal to the sum of all delays in the signal path, from inputs RST of the flip-flops to the output of the OR gate. However, the overlappings of $x_1$ and $x_2$ determined by the propagation time have no effect due to the behavior of the XOR gate, in which a logical 1 appears at its output only when its two inputs are different (i.e., when a logical 0 is present at one input of the XOR gate, and at the same time a logical 1 is present at the other input of the XOR gate). The accuracy is affected mainly by manufacturing- or design-related differences in the propagation times due to the flip-flops (clock to output delay) and propagation time differences between the two XOR inputs. This is the reason for the symmetrical design in the arrangement of the flip-flops. Also for this reason, a symmetrical design of the internal structure of the XOR gate is advantageous (see the discussion for FIG. 11 below).

Figure 11:
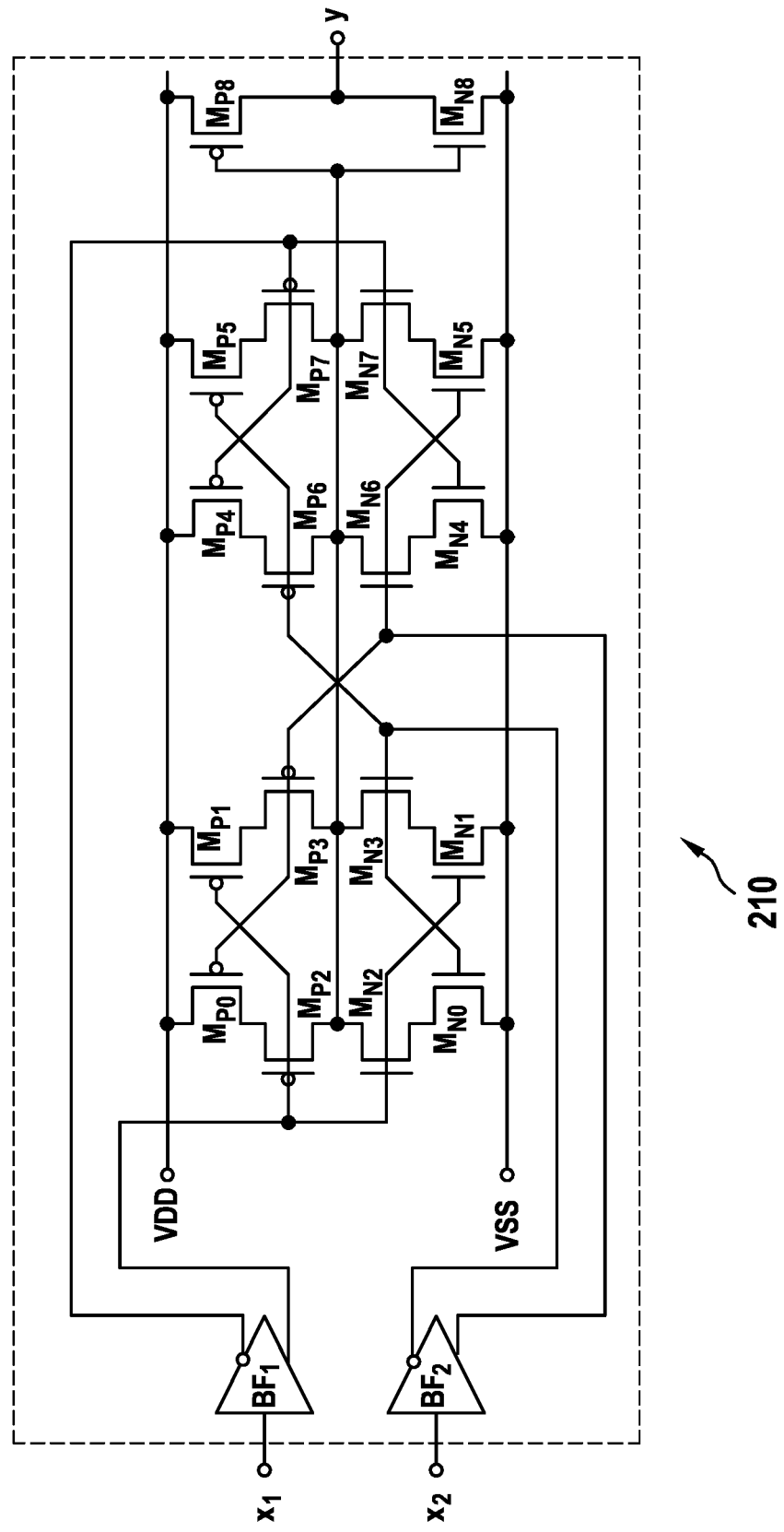
FIG. 11 shows a circuitry-based implementation of the symmetrical XOR gate/mixer.

As described above, with regard to the temporal sequences of the signal processing, a highly symmetrical XOR gate is advantageous for implementation of the circuit shown above using circuitry techniques. FIG. 11 illustrates one example of a circuit design of such a highly symmetrical XOR gate. Reference symbols VDD and VSS denote the positive and negative power supply connections, respectively. In addition, nine PMOS transistors are denoted by reference symbols $M_{P0}, M_{P1}, \ldots, M_{P8}$, and likewise nine NMOS transistors are denoted by reference symbols $M_{N0}, M_{N1}, \ldots, M_{N8}$. BF1 and BF2 are signal drivers, each with an inverting output (indicated by a circle) and a non-inverting output. Apart from the inverter at the output (implemented by transistors $M_{P8}$ and $M_{N8}$), each branch exists in duplicate in the structure of the circuit. The only difference between the branches is that the order of the transistors controlled by a certain signal has been reversed in the respective branch. The logical function thus remains unchanged. However, identical (i.e., symmetrical) signal propagation times for both XOR inputs are thus achieved. The prerequisite here is that the propagation times from the signal driver inputs to the inverting output and to the non-inverting output of the driver are the same; i.e., the inverted and the non-inverted variant of the signal are provided at the same time. A further prerequisite is that there are no differences in propagation times between the two signal drivers.

If the circuit shown in FIG. 11 is used as an XOR gate 220 in the circuit of mixer 200 in FIG. 9, the signal of nodes $x_1$ and $x_2$ of mixer 200 is supplied to the inputs of signal drivers BF1 and BF2, respectively. The output signal of the highly symmetrical XOR gate (i.e., the output of the inverter implemented by transistors $M_{P8}$ and $M_{N8}$ (see above)) is then fed into node y.

What is claimed is:

1. A method for measuring a phase shift between a first clock signal and a second clock signal, the first clock signal and the second clock signal having the same frequency, the method comprising the following steps:
   a-1) feeding the first clock signal into a first input of a mixer;
   a-2) feeding the second clock signal into a second input of the mixer, wherein the mixer includes an XOR gate that has a first input controlled using the first clock signal and a second input controlled using the second clock signal;
   d) feeding an output signal of the mixer into a low pass filter; and
   e) measuring the output signal of the low pass filter;
   wherein the method includes at least one of the following two features (I)-(II);
   (I) the method further comprises the step of f) normalizing the output signal of the low pass filter to a period duration of the first and second clock signals and an operating voltage of the mixer, wherein the normalization includes:
      (i) the output signal of the low pass filter being multiplied by one-half the period duration and divided by the operating voltage of the mixer; or
      (ii) a difference between the operating voltage of the mixer and the output signal of the low pass filter being multiplied by the period duration and divided by the operating voltage of the mixer; and
   (II) (i) the mixer includes a first edge-controlled flip-flop, a second edge-controlled flip-flop, and an AND gate (ii) step a-1) includes feeding the first clock signal into a dynamic input of the first flip-flop, (iii) step a-2) includes feeding the second clock signal into a dynamic input of the second flip-flop, and (iv) the method further comprises the steps of:
      b-1) feeding an output signal of the first flip-flop into a first input of the XOR gate and into a first input of the AND gate;
      b-2) feeding an output signal of the second flip-flop into a second input of the XOR gate and into a second input of the AND gate;
      c-1) relaying an output signal of the AND gate to a reset input of the first flip-flop; and
      c-2) relaying the output signal of the AND gate to a reset input of the second flip-flop.

2. The method as recited in claim 1, wherein an output signal of the XOR gate is fed into an input of the low pass filter.

3. The method as recited in claim 2, wherein the method includes the normalizing, and the normalizing is performed by the output signal of the low pass filter being multiplied by one-half the period duration and divided by the operating voltage of the mixer.

4. The method as recited in claim 2, wherein:
   the mixer includes the first edge-controlled flip-flop, the second edge-controlled flip-flop, and the AND gate;
   step a-1) includes the feeding of the first clock signal into the dynamic input of the first flip-flop;
   step a-2) includes the feeding of the second clock signal into the dynamic input of the second flip-flop; and
   the method further comprises the steps of:

b-1) feeding the output signal of the first flip-flop into the first input of the XOR gate and into the first input of the AND gate;

b-2) feeding the output signal of the second flip-flop into the second input of the XOR gate and into the second input of the AND gate;

c-1) relaying the output signal of the AND gate to the reset input of the first flip-flop; and c-2) relaying the output signal of the AND gate to the reset input of the second flip-flop.

5. The method as recited in claim 4, wherein:

the mixer also includes an OR gate and an inverter;

step c-1) includes feeding the output signal of the AND gate into a first input of the OR gate and feeding an output signal of the OR gate into the reset input of the first flip-flop;

step c-2) includes feeding the output signal of the AND gate into the first input of the OR gate and feeding the output signal of the OR gate into the reset input of the second flip-flop; and the method further includes the following steps:
feeding a constant activation signal into a data input of the first flip-flop, a data input of the second flip-flop, and an input of the inverter; and
feeding an output signal of the inverter into a second input of the OR gate.

6. The method as recited claim 5, wherein the method further comprises the step of normalizing the output signal of the low pass filter to the period duration of the first and second clock signals and the operating voltage of the mixer.

7. The method as recited in claim 5, wherein the output signal of the low pass filter is multiplied by the period duration and divided by the operating voltage of the mixer when the output signal of the low pass filter is less than one-half the operating voltage of the mixer.

8. The method as recited in claim 2, wherein the method includes the normalizing, and the normalizing is performed by the difference between the operating voltage of the mixer and the output signal of the low pass filter being multiplied by the period duration and divided by the operating voltage of the mixer.

9. The method as recited in claim 2, wherein the method includes the normalizing, and the normalizing is performed by the difference between the operating voltage of the mixer and the output signal of the low pass filter being multiplied by the period duration and divided by the operating voltage of the mixer when the output signal of the low pass filter is greater than or equal to one-half the operating voltage of the mixer.

10. The method as recited in claim 2, wherein the method includes the normalizing, and the normalizing is performed:
by the difference between the operating voltage of the mixer and the output signal of the low pass filter being multiplied by the period duration and divided by the operating voltage of the mixer when the output signal of the low pass filter is greater than or equal to one-half the operating voltage of the mixer; and
by the output signal of the low pass filter being multiplied by the period duration and divided by the operating voltage of the mixer when the output signal of the low pass filter is less than one-half the operating voltage of the mixer.

11. A circuit for measuring the phase shift between a first clock signal and a second clock signal, comprising:
a mixer; and
a low pass filter;

wherein:
the mixer includes a first input configured to feed in the first clock signal, a second input configured to feed in the second clock signal, and an XOR gate that has a first input controlled using the first clock signal and a second input controlled using the second clock signal;

an output of the mixer is connected to the input of the low pass filter; and the circuit includes at least one of the following two features (I)-(II):
(I) the circuit is configured to normalize the output signal of the low pass filter to a period duration of the first and second clock signals and an operating voltage of the mixer, the normalization including:
(i) the output signal of the low pass filter being multiplied by one-half the period duration and divided by the operating voltage of the mixer; or
(ii) a difference between the operating voltage of the mixer and the output signal of the low pass filter being multiplied by the period duration and divided by the operating voltage of the mixer;
the output signal of the low pass filter being multiplied by one-half the period duration and divided by the operating voltage of the mixer; and
(II) the mixer further includes:
an AND gate;
a first edge-controlled flip-flop, a dynamic input of which is the first input of the mixer and an output of which is connected to a first input of the XOR gate and to a first input of the AND gate;
a second edge-controlled flip-flop, a dynamic input of which is the second input of the mixer and an output of which is connected to a second input of the XOR gate and to a second input of the AND gate; and
a connection between (a) an output of the AND gate and (b) respective reset inputs of the first flip-flop and the second flip-flop.

12. The circuit as recited in claim 11, wherein an output of the XOR gate is connected to the input of the low pass filter.

13. The circuit as recited in claim 12, wherein the first input of the mixer is the first input of the XOR gate, and the second input of the mixer is the second input of the XOR gate.

14. The circuit as recited in claim 12, wherein the mixer further includes:
the AND gate;
the first edge-controlled flip-flop, the dynamic input of which is the first input of the mixer and the output of which is connected to the first input of the XOR gate and to the first input of the AND gate;
the second edge-controlled flip-flop, the dynamic input of which is the second input of the mixer and the output of which is connected to the second input of the XOR gate and to the second input of the AND gate; and
the connection between (a) the output of the AND gate and (b) the respective reset inputs of the first flip-flop and the second flip-flop.

15. The circuit as recited in claim 14, wherein:
the mixer further includes:
an OR gate; and
an inverter;

the connection between (a) the output of the AND gate and (b) the respective reset inputs of the first flip-flop and the second flip-flop is formed as a connection of the output of the AND gate to a first input of the OR gate, with an output of the OR gate being connected to the reset input of the first flip-flop and to the reset input of the second flip-flop;

the mixer includes a third input connected to a data input of the first flip-flop, to a data input of the second flip-flop, and to an input of the inverter; and an output of the inverter is connected to a second input of the OR gate.

16. The circuit as recited in claim 12, wherein the XOR gate is a highly symmetrical XOR gate.

17. The circuit as recited in claim 11, wherein the circuit is an integrated circuit.

18. The circuit as recited in claim 11, wherein the low pass filter is a passive low pass filter and includes a resistor and a capacitor.

19. The circuit as recited in claim 11, wherein the circuit is configured to normalize the output signal of the low pass filter to the period duration of the first and second clock signals and an operating voltage of the mixer, and the normalization includes the output signal of the low pass filter being multiplied by one-half the period duration and divided by the operating voltage of the mixer.

20. The circuit as recited in claim 11, wherein the circuit is configured to normalize the output signal of the low pass filter to the period duration of the first and second clock signals and an operating voltage of the mixer, and the normalization includes the difference between the operating voltage of the mixer and the output signal of the low pass filter being multiplied by the period duration and divided by the operating voltage of the mixer.

21. The circuit as recited in claim 11, wherein:

the circuit is configured to normalize the output signal of the low pass filter to the period duration of the first and second clock signals and an operating voltage of the mixer;

the normalization includes the output signal of the low pass filter being multiplied by one-half the period duration and divided by the operating voltage of the mixer when the output signal of the low pass filter is less than one-half the operating voltage of the mixer; and the normalization includes the difference between the operating voltage of the mixer and the output signal of the low pass filter being multiplied by the period duration and divided by the operating voltage of the mixer when the output signal of the low pass filter is more than or equal to one-half the operating voltage of the mixer.

* * * * *